(12) United States Patent
Huang

(10) Patent No.: US 10,923,207 B2
(45) Date of Patent: Feb. 16, 2021

(54) SHIFT REGISTER UNIT AND METHOD FOR DRIVING THE SAME, GATE DRIVING CIRCUIT AND DISPLAY APPARATUS

(71) Applicants: ORDOS YUANSHENG OPTOELECTRONICS CO., LTD., Ordos (CN); BOE TECHNOLOGY GROUP CO., LTD., Beijing (CN)

(72) Inventor: Fei Huang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/511,203

(22) Filed: Jul. 15, 2019

(65) Prior Publication Data

US 2020/0160929 A1 May 21, 2020

(30) Foreign Application Priority Data

Nov. 16, 2018 (CN) .......................... 201811367212.8

(51) Int. Cl.
*G09G 3/20* (2006.01)
*G11C 19/28* (2006.01)

(52) U.S. Cl.
CPC .............. *G11C 19/28* (2013.01); *G09G 3/20* (2013.01); *G09G 2310/0286* (2013.01)

(58) Field of Classification Search
CPC ... G09G 3/20; G09G 3/36; G09G 5/00; G11C 19/00; G11C 19/28
See application file for complete search history.

(56) References Cited

U.S. PATENT DOCUMENTS

2017/0103699 A1* 4/2017 Lin ...................... G09G 3/2092
2017/0193946 A1* 7/2017 Huang ................... G11C 19/28

* cited by examiner

*Primary Examiner* — Chanh D Nguyen
*Assistant Examiner* — Nguyen H Truong
(74) *Attorney, Agent, or Firm* — Kinney & Lange, P.A.

(57) ABSTRACT

The present disclosure discloses a shift register unit and a method for driving the same, a gate driving circuit and a display apparatus, wherein the shift register unit includes: an input sub-circuit connected to a signal input terminal and a signal control terminal, and configured to output an input signal provided at the signal input terminal under action of a control signal provided at the signal control terminal; a carry signal output sub-circuit connected to a first clock signal terminal and a first enabling signal terminal, and configured to generate a carry signal according to an input signal output by the input sub-circuit, a first clock signal provided at the first clock signal terminal and a first enabling signal provided at the first enabling signal terminal; an output sub-circuit connected to a second clock signal terminal and configured to generate an output signal according to the carry signal and a second clock signal provided at the second clock signal terminal; and a latch sub-circuit configured to latch the output signal.

19 Claims, 6 Drawing Sheets

SHIFT REGISTER UNIT AND METHOD FOR DRIVING THE SAME, GATE DRIVING CIRCUIT AND DISPLAY APPARATUS

CROSS-REFERENCE TO RELATED APPLICATION(S)

This application claims priority to the Chinese Patent Application No. 201811367212.8, filed on Nov. 16, 2018, which is incorporated herein by reference in its entirety.

TECHNICAL FIELD

The present disclosure relates to the field of display technology, and more particularly, to a shift register unit, a gate driving circuit, a display apparatus, and a method for driving a shift register unit.

BACKGROUND

With the progress of display technology, the requirements for display driving circuits are getting higher and higher. A Gate Driver on Array (GOA) circuit may be used to effectively reduce a number of Integrated Circuits (ICs) used, thereby reducing a cost of a panel. However, current GOA circuits still have a problem of poor stability.

SUMMARY

According to a first aspect of the present disclosure, there is proposed a shift register unit, comprising: an input sub-circuit connected to a signal input terminal and a signal control terminal respectively, and configured to output an input signal provided at the signal input terminal under control of a control signal provided at the signal control terminal; a carry signal output sub-circuit connected to a first clock signal terminal and a first enabling signal terminal respectively, and configured to generate a carry signal according to an input signal output by the input sub-circuit, a first clock signal provided at the first clock signal terminal and a first enabling signal provided at the first enabling signal terminal; an output sub-circuit connected to a second clock signal terminal and configured to generate an output signal according to the carry signal and a second clock signal provided at the second clock signal terminal; and a latch sub-circuit configured to latch the output signal.

According to an embodiment of the present disclosure, the signal input terminal comprises a first signal input terminal and a second signal input terminal, the signal control terminal comprises a first signal control terminal and a second signal control terminal, and the input sub-circuit comprises: a first transmission gate having an input terminal connected to the first signal input terminal, and a first gating signal terminal connected to the first signal control terminal; and a second transmission gate, wherein an input terminal of the second transmission gate is connected to the second signal input terminal, a first gating signal terminal of the second transmission gate and a second gating signal terminal of the first transmission gate are connected to the second signal control terminal, a second gating signal terminal of the second transmission gate is connected to the first signal control terminal, and an output terminal of the second transmission gate is connected to an output terminal of the first transmission gate to act as an output terminal of the input sub-circuit.

According to an embodiment of the present disclosure, the first transmission gate is configured to be turned on in a forward scanning phase in which a first control signal provided at the first signal control terminal is at a high level and a second control signal provided at the second signal control terminal is at a low level, to output a first input signal provided at the first signal input terminal; and the second transmission gate is configured to be turned on in a reverse scanning phase in which the first control signal provided at the first signal control terminal is at a low level and the second control signal provided at the second signal control terminal is at a high level, to output a second input signal provided at the second signal input terminal.

According to an embodiment of the present disclosure, the first clock signal provided at the first clock signal terminal in the forward scanning phase is a reversed signal of the first clock signal provided at the first clock signal terminal in the reverse scanning phase.

According to an embodiment of the present disclosure, the output sub-circuit comprises: a third transmission gate having an input terminal connected to the second clock signal terminal, and a first gating signal terminal connected to an output terminal of the carry signal output sub-circuit to receive the carry signal; a first inverter having an input terminal connected to the first gating signal terminal of the third transmission gate, and an output terminal connected to a second gating signal terminal of the third transmission gate; a second inverter having an input terminal connected to an output terminal of the third transmission gate; and a third inverter having an input terminal connected to an output terminal of the second inverter, and an output terminal acting as an output terminal of the output sub-circuit.

According to an embodiment of the present disclosure, the latch sub-circuit comprises: a first transistor having a control terminal connected to the output terminal of the output sub-circuit, a first terminal connected to a power signal terminal, and a second terminal connected to the input terminal of the third inverter; and a second transistor having a control terminal connected to the output terminal of the output sub-circuit, a first terminal connected to a reference signal terminal, and a second terminal connected to the input terminal of the third inverter.

According to an embodiment of the present disclosure, the shift register unit further comprises: a reset sub-circuit connected to a second enabling signal terminal, and configured to generate a reset signal according to a second enabling signal provided at the second enabling signal terminal to be output through the output sub-circuit.

According to an embodiment of the present disclosure, the reset sub-circuit comprises: a third transistor and a fourth transistor, wherein a control terminal of the third transistor and a control terminal of the fourth transistor are connected to the second enabling signal terminal, a first terminal of the third transistor is connected to a power signal terminal, and a second terminal of the third transistor and a first terminal of the fourth transistor are connected to the input terminal of the second inverter; and a fifth transistor having a control terminal connected to the output terminal of the first inverter, a first terminal connected to a second terminal of the fourth transistor, and a second terminal connected to a reference signal terminal.

According to an embodiment of the present disclosure, the carry signal output sub-circuit comprises: a NOR gate having a first input terminal connected to an output terminal of the input sub-circuit; a sixth transistor and a seventh transistor, wherein a control terminal of the sixth transistor and a control terminal of the seventh transistor are connected to an output terminal of the NOR gate, a first terminal of the sixth transistor is connected to the first clock signal terminal, a second terminal of the sixth transistor is connected to a first terminal of the seventh transistor at a first node, the first node is connected to a second input terminal of the NOR gate, and a second terminal of the seventh transistor is connected to a reference signal terminal; a fourth inverter having an input terminal connected to the first node; a fourth transmission gate having an input terminal connected to the first enabling signal terminal, a first gating signal terminal connected to an output terminal of the fourth inverter, and a second gating signal terminal connected to the first node; and an eighth transistor having a control terminal connected to the first node, a first terminal connected to an output terminal of the fourth transmission gate to act as an output terminal of the carry signal output sub-circuit, and a second terminal connected to a reference signal terminal.

According to another embodiment of the present disclosure, the carry signal output sub-circuit comprises: a NAND gate having a first input terminal connected to an output terminal of the input sub-circuit; a ninth transistor and a tenth transistor, wherein a control terminal of the ninth transistor and a control terminal of the tenth transistor are connected to an output terminal of the NAND gate, a first terminal of the ninth transistor is connected to a power signal terminal, a second terminal of the ninth transistor is connected to a first terminal of the tenth transistor at a second node, the second node is connected to a second input terminal of the NAND gate, and a second terminal of the tenth transistor is connected to the first clock signal terminal; an eleventh transistor having a control terminal connected to the first enabling signal terminal, a first terminal connected to the power signal terminal, and a second terminal connected to the second node; a fifth inverter having an input terminal connected to the second node; a fifth transmission gate having an input terminal connected to the first enabling signal terminal, a first gating signal terminal connected to an output terminal of the fifth inverter, and a second gating signal terminal connected to the second node; and a twelfth transistor having a control terminal connected to the output terminal of the fifth inverter, a first terminal connected to an output terminal of the fifth transmission gate to act as an output terminal of the carry signal output sub-circuit, and a second terminal connected to the reference signal terminal.

According to a second aspect of the present disclosure, there is proposed a gate driving circuit, comprising N cascaded shift register units, wherein N is an integer greater than 1, and each of the N cascaded shift register units comprises: an input sub-circuit connected to a signal input terminal and a signal control terminal, and configured to output an input signal provided at the signal input terminal under control of a control signal provided at the signal control terminal; a carry signal output sub-circuit connected to a first clock signal terminal and a first enabling signal terminal, and configured to generate a carry signal according to an input signal output by the input sub-circuit, a first clock signal provided at the first clock signal terminal and a first enabling signal provided at the first enabling signal terminal; an output sub-circuit connected to a second clock signal terminal and configured to generate an output signal according to the carry signal and a second clock signal provided at the second clock signal terminal; and a latch sub-circuit configured to latch the output signal.

According to a third aspect of the present disclosure, there is proposed a display apparatus, comprising the gate driving circuit described above.

According to a fourth aspect of the present disclosure, there is proposed a method for driving the shift register unit described above, comprising steps of: applying a control signal to the signal control terminal to control the input sub-circuit to input an input signal provided at the signal input terminal to the carry signal output sub-circuit; applying a first clock signal to the first clock signal terminal and applying a first enabling signal to the first enabling signal terminal to control the carry signal output sub-circuit to generate a carry signal according to the first clock signal, the first enabling signal and the input signal; applying a second clock signal to the second clock signal terminal to control the output sub-circuit to generate an output signal according to the second clock signal and the carry signal; and controlling the latch sub-circuit to latch the output signal.

According to an embodiment of the present disclosure, the control signal comprises a first control signal and a second control signal, the input signal comprises a first input signal and a second input signal, and the input sub-circuit of the shift register unit comprises a first transmission gate and a second transmission gate, wherein in a forward scanning phase, the first control signal is at a high level, the second control signal is at a low level, and the first transmission gate is turned on to output the first input signal provided at the first signal input terminal; and in a reverse scanning phase, the first control signal is at a low level, the second control signal is at a high level, and the second transmission gate is turned on to output the second input signal provided at the second signal input terminal.

According to an embodiment of the present disclosure, the first clock signal in the reverse scanning phase is a reversed signal of the first clock signal in the forward scanning phase.

According to an embodiment of the present disclosure, a frequency of the second clock signal is twice that of the first clock signal.

BRIEF DESCRIPTION OF THE DRAWINGS

FIG. 2b is an operational timing diagram of the shift register unit shown in FIG. 2a;

FIG. 5b is an operational timing diagram of the shift register unit shown in FIG. 5a;

DETAILED DESCRIPTION

The embodiments of the present disclosure will be described in detail below, and examples of the embodiments are illustrated in the accompanying drawings, wherein the same or similar reference signs are used to refer to the same or similar elements or elements having the same or similar functions. The embodiments described below with reference to the accompanying drawings are illustrative, are not intended to explain the present disclosure, and may not be understood as limiting the present disclosure.

The present disclosure proposes a shift register unit, a gate driving circuit, a display apparatus, and a method for driving a shift register unit. A latch sub-circuit is added at an output terminal of the shift register unit to latch an output signal, which may effectively reduce noise of the output signal, enhance the driving capability of the output signal, and improve stability and effectiveness of the output signal, thereby effectively improving the performance of the display panel.

A shift register unit, a gate driving circuit, and a display apparatus according to an embodiment of the present disclosure will be described below with reference to the accompanying drawings.

Figure 1:
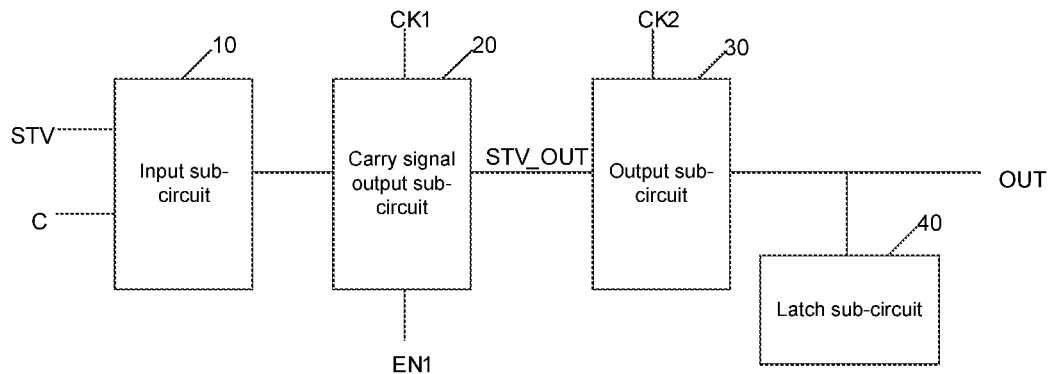
FIG. 1 is a schematic structural diagram of a shift register unit according to an embodiment of the present disclosure.

FIG. 1 is a schematic structural diagram of a shift register unit according to an embodiment of the present disclosure. As shown in FIG. 1, the shift register unit according to the embodiment of the present disclosure may comprise an input sub-circuit 10, a carry signal output sub-circuit 20, an output sub-circuit 30, and a latch sub-circuit 40.

Here, the input sub-circuit 10 is connected to a signal input terminal STV and a signal control terminal C respectively, and may output an input signal provided at the signal input terminal STV under control of a control signal provided at the signal control terminal C. The carry signal output sub-circuit 20 is connected to a first clock signal terminal CK1 and a first enabling signal terminal EN1, and may generate a carry signal STV_OUT according to the input signal, a first clock signal provided at the first clock signal terminal CK1, and a first enabling signal provided at the first enabling signal terminal EN1. The output sub-circuit 30 is connected to a second clock signal terminal CK2, and may generate an output signal according to the carry signal STV_OUT and a second clock signal provided at the second clock signal terminal CK2 to be output at an output terminal OUT of the shift register unit. The latch sub-circuit 40 may latch the output signal at the output terminal OUT.

Since the latch sub-circuit 40 may latch the output signal to maintain the output signal in a current state, the noise of the output signal may be effectively reduced, the driving capability of the output signal may be enhanced, and the stability and the effectiveness of the output signal may be improved, thereby effectively improving the performance of the display panel.

Figure 2A:
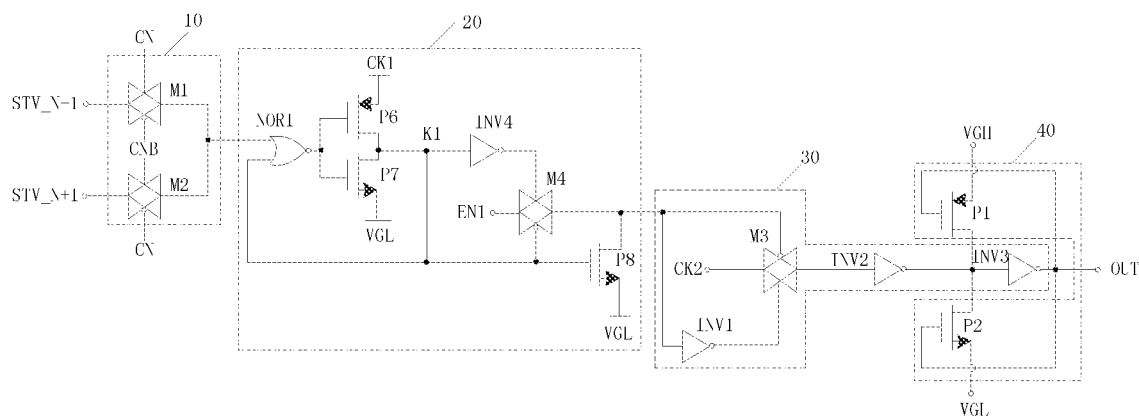
FIG. 2a is a schematic structural diagram of a shift register unit according to an embodiment of the present disclosure.

According to an embodiment of the present disclosure, as shown in FIG. 2a, the signal input terminal comprises a first signal input terminal STV_N−1 and a second signal input terminal STV_N+1, the signal control terminal comprises a first signal control terminal CN and a second signal control terminal CNB, and the input sub-circuit 10 may comprise a first transmission gate M1 and a second transmission gate M2. The first transmission gate M1 has an input terminal connected to the first signal input terminal STV_N−1, and a first gating signal terminal connected to the first signal control terminal CN. An input terminal of the second transmission gate M2 is connected to the second signal input terminal STV_N+1, and a first gating signal terminal of the second transmission gate M2 and a second gating signal terminal of the first transmission gate M1 are connected to the second signal control terminal CNB. A second gating signal terminal of the second transmission gate M2 is connected to the first signal control terminal CN, and an output terminal of the second transmission gate M2 is connected to an output terminal of the first transmission gate M1 to act as an output terminal of the input sub-circuit 10.

When a first control signal provided at the first signal control terminal CN is at a high level and a second control signal provided at the second signal control terminal CNB is at a low level, the shift register unit performs forward scanning, and the first transmission gate M1 is turned on to output a first input signal provided at the first signal input terminal STV_N−1. When the first control signal provided at the first signal control terminal CN is at a low level and the second control signal provided at the second signal control terminal CNB is at a high level, the shift register unit performs reverse scanning, and the second transmission gate M2 is turned on to output a second input signal provided at the second signal input terminal STV_N+1.

In some embodiments, the first input signal provided at the first signal input terminal STV_N−1 may be an output signal of a previous stage of shift register unit, the second input signal provided at the second signal input terminal STV_N+1 may be an output signal of a next stage of shift register unit, and the first control signal provided at the first signal control terminal CN and the second control signal provided at the second signal control terminal CNB are both direct current signals.

When the shift register unit performs forward scanning, the first control signal provided at the first signal control terminal CN is at a high level, the second control signal provided at the second signal control terminal CNB is at a low level, and the first transmission gate M1 is turned on. At this time, the output signal of the previous stage of shift register unit is transmitted to the output terminal of the input sub-circuit 10 through the first transmission gate M1 as an input signal of the current stage of shift register unit. When the shift register unit performs reverse scanning, the first control signal provided at the first signal control terminal CN is at a low level, the second control signal provided at the second signal control terminal CNB is at a high level, and the second transmission gate M2 is turned on. At this time, the output signal of the next stage of shift register unit is transmitted to the output terminal of the input sub-circuit 10 through the second transmission gate M2 as the input signal of the current stage of shift register unit. Therefore, the input of the signals when the shift register unit performs forward scanning and reverse scanning may be realized by the two transmission gates under control of different control signals, which achieves a simple circuit structure and high reliability.

It should be illustrated that when the shift register unit only needs to perform forward scanning, the second transmission gate M2 may be omitted; and when the shift register unit only needs to perform reverse scanning, the first transmission gate M1 may be omitted.

According to an embodiment of the present disclosure, as shown in FIG. 2a, the carry signal output sub-circuit 20 may comprise a NOR gate NOR1, a sixth transistor P6, a seventh transistor P7, a fourth inverter INV4, a fourth transmission gate M4, and an eighth transistor P8. The NOR gate NOR1 has a first input terminal connected to the output terminal of input sub-circuit 10. A control terminal of the sixth transistor P6 and a control terminal of the seventh transistor P7 are connected to an output terminal of the NOR gate NOR1, a first terminal of the sixth transistor P6 is connected to the first clock signal terminal CK1, a second terminal of the sixth transistor P6 is connected to a first terminal of the seventh transistor P7 at a first node K1, the first node K1 is connected to a second input terminal of the NOR gate NOR1, and a second terminal of the seventh transistor P7 is connected to a reference signal terminal VGL. The fourth inverter INV4 has an input terminal connected to the first node K1. The fourth transmission gate M4 has an input terminal connected to the first enabling signal terminal EN1, a first gating signal terminal connected to an output terminal of the fourth inverter INV4, and a second gating signal terminal connected to the first node K1. The eighth transistor P8 has a control terminal connected to the first node K1, a first terminal connected to an output terminal of the fourth transmission gate M4 to act as an output terminal of the carry signal output sub-circuit 20, and a second terminal connected to the reference signal terminal VGL.

The output sub-circuit 30 may comprise a third transmission gate M3, a first inverter INV1, a second inverter INV2, and a third inverter INV3. The third transmission gate M3 has an input terminal connected to the second clock signal terminal CK2, and a first gating signal terminal connected to the output terminal of the carry signal output sub-circuit 20 to receive the carry signal. The first inverter INV1 has an input terminal connected to the first gating signal terminal of the third transmission gate M3, and an output terminal connected to a second gating signal terminal of the third transmission gate M3. The second inverter INV2 has an input terminal connected to an output terminal of the third transmission gate M3. The third inverter INV3 has an input terminal connected to an output terminal of the second inverter INV2, and an output terminal acting as an output terminal of the output sub-circuit 30 (i.e., the output terminal OUT of the shift register unit).

The latch sub-circuit 40 may comprise a first transistor P1 and a second transistor P2. The first transistor P1 has a control terminal connected to the output terminal of the output sub-circuit 30, a first terminal connected to a power signal terminal VGH, and a second terminal connected to the input terminal of the third inverter INV3. The second transistor P2 has a control terminal connected to the output terminal of the output sub-circuit 30, a first terminal connected to the reference signal terminal VGL, and a second terminal connected to the input terminal of the third inverter INV3.

Figure 2B:
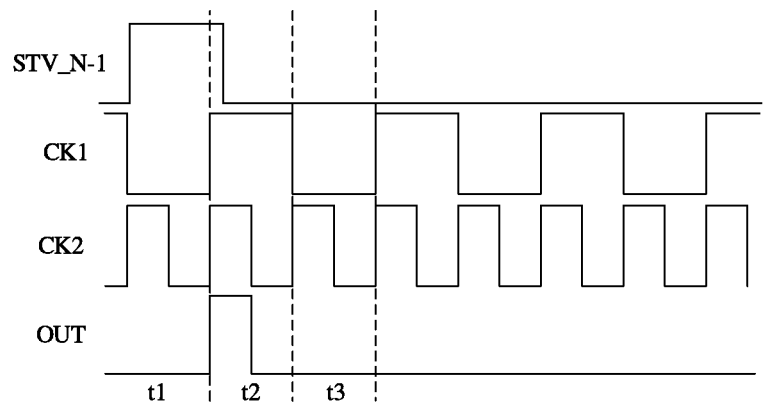

In the example shown in FIG. 2a, the first transistor P1 and the sixth transistor P6 may be P-channel Metal Oxide Semiconductor (PMOS) transistors, the second transistor P2, the seventh transistor P7, and the eighth transistor P8 may be N-channel Metal Oxide Semiconductor (NMOS) transistors, a voltage provided at the power signal terminal VGH is a high voltage, a voltage provided at the reference signal terminal VGL is a low voltage, the first clock signal provided at the first clock signal terminal CK1 and the second clock signal provided at the second clock signal terminal CK2 may be as shown in FIG. 2b, and the first enabling signal provided at the first enabling signal terminal EN1 is at a high level.

An operation process of the shift register unit shown in FIG. 2a will be described in detail below with reference to FIG. 2b. For the sake of simplicity, the description is made in FIG. 2b by taking the shift register unit performing forward scanning as an example.

In a period t1, a start signal of the shift register unit is at a high level, that is, the input signal provided at the first signal input terminal STV_N−1 is at a high level, the first clock signal provided at the first clock signal terminal CK1 is at a low level, and the second clock signal provided at the second clock signal terminal CK2 is firstly at a high level and then at a low level. When the first control signal provided at the first signal control terminal CN is at a high level, and the second control signal provided at the second signal control terminal CNB is at a low level, the first transmission gate M1 is turned on and outputs a high level, the NOR gate NOR1 outputs a low level, the sixth transistor P6 is turned on, and the first clock signal provided at the first clock signal terminal CK1 is input to the fourth inverter INV4 through the sixth transistor P6. Since the first clock signal provided at the first clock signal terminal CK1 is at a low level, a level at the first node K1 is a low level, the fourth inverter INV4 outputs a high level, and the fourth transmission gate M4 is turned on. Since the first enabling signal provided at the first enabling signal terminal EN1 is at a high level, the fourth transmission gate M4 outputs a high level, and the third transmission gate M3 is turned off. At this time, the output signal at the output terminal of the output sub-circuit 30 (i.e., the output terminal OUT of the shift register unit) is initially at a low level.

In a period t2, the start signal of the shift register unit is firstly maintained at a high level for a period of time and then changes to a low level, that is, the input signal provided at the first signal input terminal STV_N−1 is maintained at a high level for a period of time and then changes to a low level, the first clock signal provided at the first clock signal terminal CK1 is at a high level, and the second clock signal provided at the second clock signal terminal CK2 is firstly at a high level and then at a low level. As in the period t1, under action of the control signals provided at the first signal control terminal CN and the second signal control terminal CNB, the first transmission gate M1 is still in a turn-on state, and the first transmission gate M1 firstly outputs a high level for a period of time. In this process, the NOR gate NOR1 outputs a low level, the sixth transistor P6 is turned on, and the first clock signal provided at the first clock signal terminal CK1 is input to the fourth inverter INV4 through the sixth transistor P6. Since the first clock signal provided at the first clock signal terminal CK1 is at a high level, the level at the first node K1 is a high level, the fourth inverter INV4 outputs a low level, the fourth transmission gate M4 is turned off, the eighth transistor P8 is turned on at the same time, the first terminal of the eighth transistor P8 is at a low level, and the third transmission gate M3 is turned on. Since the second clock signal provided at the second clock signal terminal CK2 is at a high level, the third transmission gate M3 outputs a high level, and the output signal of the output sub-circuit 30 is at a high level at this time, that is, the output terminal OUT of the shift register unit is at a high level.

Then, when the input signal provided at the first signal input terminal STV_N−1 becomes a low level, the first transmission gate M1 outputs a low level, but under action of the first clock signal provided at the first clock signal terminal CK1 and the sixth transistor P6, even if the first transmission gate M1 outputs a low level, the level at the first node K1 is still maintained as a high level. Therefore, the fourth inverter INV4 continues to output a low level, the fourth transmission gate M4 is turned off, the eighth transistor P8 is turned on, and the third transmission gate M3 is turned on. When the second clock signal provided at the second clock signal terminal CK2 is at a high level, the output signal of the output sub-circuit 30 (i.e., the output signal at the output terminal OUT of the shift register unit) is at a high level, and when the second clock signal provided at the second clock signal terminal CK2 becomes a low level, the output signal of the output sub-circuit 30 (i.e., the output signal at the output terminal OUT of the shift register unit) changes from a high level to a low level.

In a period t3, the start signal of the shift register unit is at a low level, i.e., the input signal provided at the first signal input terminal STV_N−1 is at a low level, the first clock signal provided at the first clock signal terminal CK1 is at a low level, and the second clock signal provided at the second clock signal terminal CK2 is firstly at a high level and then at a low level. When the input signal provided at the first signal input terminal STV_N−1 is at a low level, the first transmission gate M1 outputs a low level. Since the level at the first node K1 is a high level in the period t2, the NOR gate NOR1 outputs a low level, and the sixth transistor P6 is turned on. Since the first clock signal provided at the first clock signal terminal CK1 is at a low level, the level at the first node K1 becomes a low level, the NOR gate NOR1 outputs a high level, the seventh transistor P7 is turned on, the level at the first node K1 continues to be a low level, the fourth inverter INV4 outputs a high level, the fourth transmission gate M4 is turned on, the fourth transmission gate M4 outputs a high level, and the third transmission gate M3 is turned off. As in the period t1, the output signal of the output sub-circuit 30 (i.e., the output signal at the output terminal OUT of the shift register unit) is at a low level. Then, the output signal OUT of the output sub-circuit 30 continues to be at a low level.

In the above process, when the output signal at the output terminal OUT is at a low level, the first transistor P1 is turned on, the input terminal of the third inverter INV3 is at a high level, and the third inverter INV3 outputs a low level, so that the output signal at the output terminal OUT is maintained at a low level. When the output signal at the output terminal OUT is at a high level, the second transistor P2 is turned on, the input terminal of the third inverter INV3 is at a low level, and the third inverter INV3 outputs a high level, so that the output signal at the output terminal OUT is maintained at a high level. A PMOS transistor and an NMOS transistor are added at the output terminal to form a loop, so as to latch the output signal, thereby effectively reducing the noise of the output signal while enhancing the driving capability of the output signal. Further, the first transistor P1 and the second transistor P2 enable the input signal of the third inverter INV3 to be always maintained at a high level/low level, so that the output signal of the third inverter INV3 may be quickly reversed, and thereby the output signal may be quickly reversed, thereby improving the stability and the effectiveness of the output signal. Thus, the output signal is latched by the latch sub-circuit 40, so that the output signal may be maintained in the current state, which may effectively reduce the noise of the output signal, enhance the driving capability of the output signal, and improve the stability and the effectiveness of the output signal, thereby effectively improving the performance of the display panel.

According to an embodiment of the present disclosure, the first clock signal provided at the first clock signal terminal CK1 when the shift register unit performs forward scanning is at an opposite level to that of the first clock signal provided at the first clock signal terminal CLK1 when the shift register unit performs reverse scanning, that is, the former first clock signal is a reversed signal of the latter first clock signal.

For example, as shown in FIG. 2a, when the shift register unit performs forward scanning, the first control signal provided at the first signal control terminal CN is at a high level, and the second control signal provided at the second signal control terminal CNB is at a low level. The first clock signal provided at the first clock signal terminal CK1 and the second clock signal provided at the second clock signal terminal CK2 are as shown in FIG. 2b. When the shift register unit performs reverse scanning, the first control signal provided at the first signal control terminal CN is at a low level, and the second control signal provided at the second signal control terminal CNB is at a high level. The first clock signal provided at the first clock signal terminal CK1 is a revered signal of the first clock signal shown in FIG. 2b, and the second clock signal provided at the second clock signal terminal CK2 is the same as the second clock signal shown in FIG. 2b. A specific process of reverse scanning may be known with reference to that of forward scanning, and will not be described in detail here.

Figure 3:
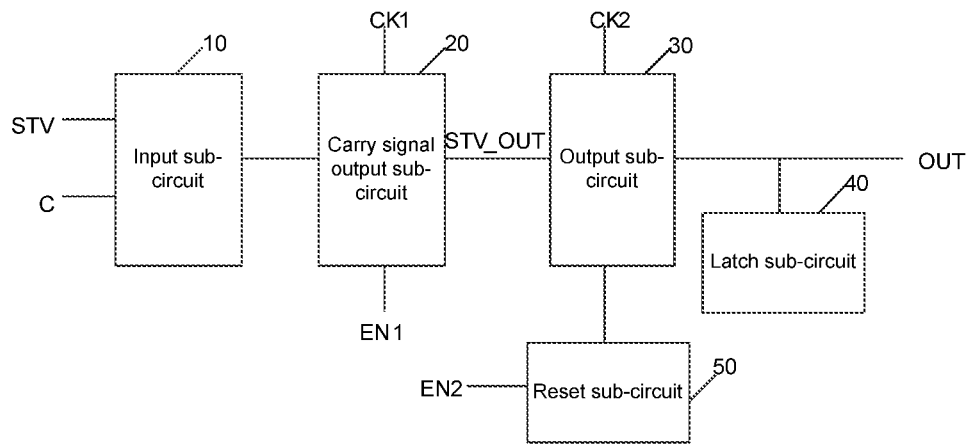
FIG. 3 is a schematic structural diagram of a shift register unit according to an embodiment of the present disclosure.

According to an embodiment of the present disclosure, as shown in FIG. 3, the shift register unit may further comprise: a reset sub-circuit 50 connected to the second enabling signal terminal EN2, and may generate a reset signal according to the second enabling signal provided at the second enabling signal terminal EN2 to be output through the output sub-circuit 30, so that a pixel circuit corresponding to the shift register unit is quickly discharged or reset according to the reset signal.

Figure 4:
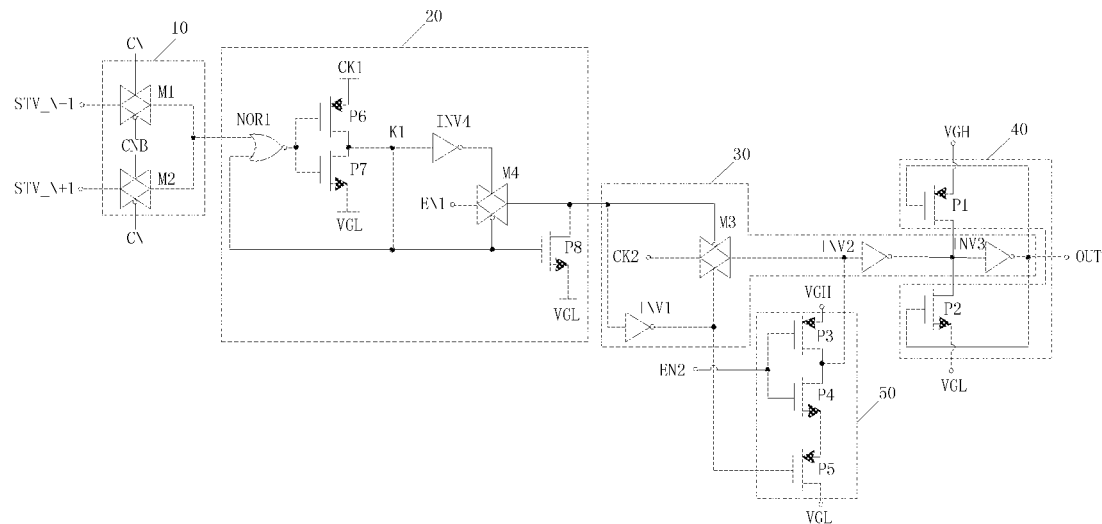
FIG. 4 is a schematic structural diagram of a shift register unit according to another embodiment of the present disclosure.

According to an embodiment of the present disclosure, as shown in FIG. 4, the reset sub-circuit 50 may comprise a third transistor P3, a fourth transistor P4, and a fifth transistor P5. A control terminal of the third transistor P3 and a control terminal of the fourth transistor P4 are connected to the second enabling signal terminal EN2, a first terminal of the third transistor P3 is connected to the power signal terminal VGH, and a second terminal of the third transistor P3 and a first terminal of the four transistor P4 are connected to the input terminal of the second inverter INV2. The fifth transistor P5 has a control terminal connected to the output terminal of the first inverter INV1, a first terminal connected to a second terminal of the fourth transistor P4, and a second terminal connected to the reference signal terminal VGL.

In the example shown in FIG. 4, the third transistor P3 and the fifth transistor P5 may be PMOS transistors, and the fourth transistor P4 may be an NMOS transistor. In a normal operation process, the second enabling signal provided at the second enabling signal terminal EN2 is at a high level, and when the second enabling signal provided at the second enabling signal terminal EN2 is at a low level, the procedure enters a rapid discharging or resetting mode.

Specifically, when the second enabling signal provided at the second enabling signal terminal EN2 is at a high level, it may be seen from the above analysis that in the period t1, the fourth transmission gate M4 outputs a high level, the first inverter INTV1 outputs a low level, the fourth transistor P4 and the fifth transistor P5 are both turned on at this time, the input terminal of the second inverter INV2 is at a low level, and the output signal of the output sub-circuit 30 (i.e., the output signal at the output terminal OUT) is at a low level. In the period t2, the first terminal of the eighth transistor P8 is at a low level, the third transmission gate M3 is turned on, and when the second clock signal provided at the second clock signal terminal CK2 is at a high level, the third transmission gate M3 outputs a high level, and the first inverter INV1 outputs a high level. At this time, the fourth transistor P4 is turned on, the input terminal of the second inverter INV2 is at a high level, and the output signal of the output sub-circuit 30 (i.e., the output signal at the output terminal OUT) is at a high level. When the second clock signal provided at the second clock signal terminal CK2 becomes a low level, the third transmission gate M3 outputs a low level, and the first inverter INV1 outputs a high level. At this time, the fourth transistor P4 is turned on, the input terminal of the second inverter INV2 is at a low level, and the output signal OUT1 of the output sub-circuit 30 is at a low level. In the period t3, the fourth transmission gate M4 outputs a high level, the first inverter INV1 outputs a low level, the fourth transistor P4 and the fifth transistor P5 are both turned on at this time, the input terminal of the second inverter INV2 is at a low level, and the output signal of the output sub-circuit 30 (i.e., the output signal at the output terminal OUT) is at a low level. Processes in subsequent periods are the same as that in the period t3.

When the second enabling signal provided at the second enabling signal terminal EN2 is at a low level, for example, the second enabling signal provided at the second enabling signal terminal EN2 is at a low level after each frame time ends, the third transistor P3 and the fifth transistor P5 are turned on at this time, the input terminal of the second inverter INV2 is at a high level, and the output signal of the output sub-circuit 30 (i.e., the output signal at the output terminal OUT) is at a high level. In this way, transistors of the pixel circuit in a display area are turned on, charges of the pixel circuit are released, and when the second enabling signal provided at the second enabling signal terminal EN2 is at a low level for a period of time, the charges may be completely released, thereby realizing rapid discharging or resetting of the pixel circuit.

Figure 5A:
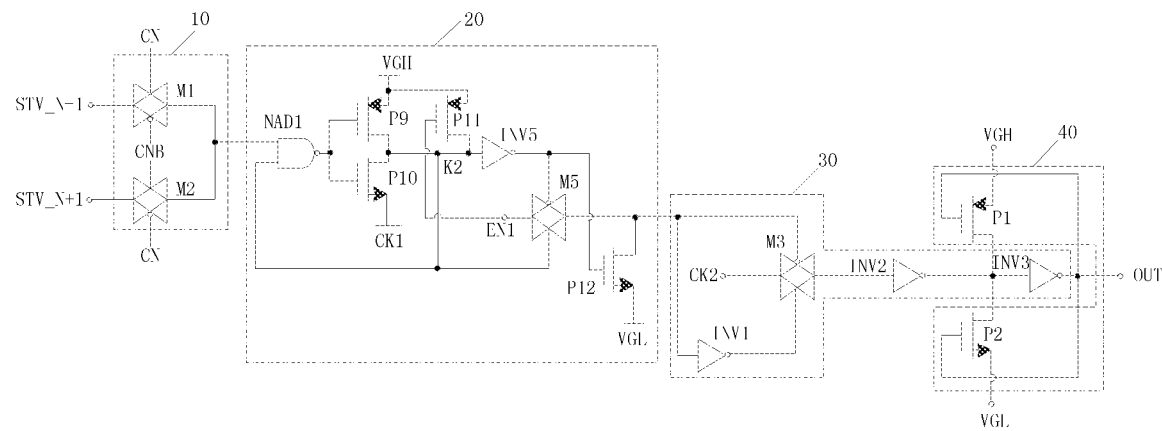
FIG. 5a is a schematic structural diagram of a shift register unit according to still another embodiment of the present disclosure.

According to another embodiment of the present disclosure, as shown in FIG. 5a, the carry signal output sub-circuit 20 may comprise a NAND gate NAD1, a ninth transistor P9, a tenth transistor P10, an eleventh transistor P11, a fifth inverter INV5, a fifth transmission gate M5 and a twelfth transistor P12. The NAND gate NAD1 has a first input terminal connected to the output terminal of input sub-circuit 10. The ninth transistor P9 has a control terminal connected to a control terminal of the tenth transistor P10 and then connected to an output terminal of the NAND gate NAD1, a first terminal connected to the power signal terminal VGH, and a second terminal connected to a first terminal of the tenth transistor P10 and having a second node K2. The second node K2 is connected to a second input terminal of the NAND gate NAD1, and a second terminal of the tenth transistor P10 is connected to the first clock signal terminal CK1. The eleventh transistor P11 has a control terminal connected to the first enabling signal terminal EN1, a first terminal connected to the power signal terminal VGH, and a second terminal connected to the second node K2. The fifth inverter INV5 has an input terminal connected to the second node K2. The fifth transmission gate M5 has an input terminal connected to the first enabling signal terminal EN1, a first gating signal terminal connected to an output terminal of the fifth inverter INV5, and a second gating signal terminal connected to the second node K2. The twelfth transistor P12 has a control terminal connected to the output terminal of the fifth inverter INV5, a first terminal connected to an output terminal of the fifth transmission gate M5 to act as the output terminal of the carry signal output sub-circuit 20, and a second terminal connected to the reference signal terminal VGL.

Figure 5B:
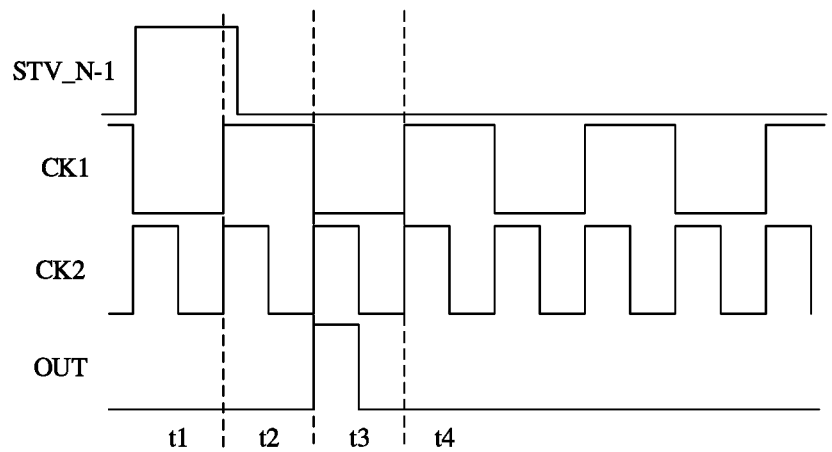

In the example shown in FIG. 5a, the ninth transistor P9 and the eleventh transistor P11 may be PMOS transistors, the tenth transistor P10 and the twelfth transistor P12 may be NMOS transistors, the voltage provided at the power signal terminal VGH is a high voltage, the voltage provided at the reference signal terminal VGL is a low voltage, the first clock signal provided at the first clock signal terminal CK1 and the second clock signal provided at the second clock signal terminal CK2 are as shown in FIG. 5b, and the first enabling signal provided at the first enabling signal terminal EN1 is at a high level.

An operation process of the shift register unit shown in FIG. 5a will be described in detail below with reference to FIG. 5b. For the sake of simplicity, description is made in FIG. 5b by taking the shift register unit performing forward scanning as an example.

In a period t1, the start signal of the shift register unit is at a high level, that is, the input signal provided at the first signal input terminal STV_N−1 is at a high level, the first clock signal provided at the first clock signal terminal CK1 is at a low level, and the second clock signal provided at the second clock signal terminal CK2 is firstly at a high level and then at a low level. When the first control signal provided at the first signal control terminal CN is at a high level, and the second control signal provided at the second signal control terminal CNB is at a low level, the first transmission gate M1 is turned on and outputs a high level. In an initial case, the level at the second node K2 is a high level (when the shift register unit does not operate, the first enabling signal provided at the first enabling signal terminal EN1 is at a low level, the eleventh transistor P11 is turned on, and the level at the second node K2 is a high level), the NAND gate NAD1 outputs a low level, the ninth transistor P9 is turned on, and the level at the second node K2 is maintained as a high level. The fifth inverter INV5 outputs a low level, the fifth transmission gate M5 is turned on and outputs a high level, the third transmission gate M3 is turned off, and the output signal of the output sub-circuit 30 (i.e., the output signal at the output terminal OUT) is at a low level at this time.

In a period t2, the start signal of the shift register unit is firstly maintained at a high level for a period of time and then changes to a low level, that is, the input signal provided at the first signal input terminal STV_N−1 is firstly maintained at a high level for a period of time and then changes to a low level, the first clock signal provided at the first clock signal terminal CK1 is at a high level, and the second clock signal provided at the second clock signal terminal CK2 is firstly at a high level and then at a low level. As in the period t1, under action of the control signals provided at the first signal control terminal CN and the second signal control terminal CNB, the first transmission gate M1 is still in a turn-on state, and the first transmission gate M1 firstly outputs a high level for a period of time. In this process, the NAND gate NAD1 outputs a low level, the ninth transistor P9 is turned on, and the level at the second node K2 is maintained as a high level. The fifth inverter INV5 outputs a low level, the fifth transmission gate M5 is turned on and outputs a high level, the third transmission gate M3 is turned off, and the output signal of the output sub-circuit 30 (i.e., the output signal at the output terminal OUT) is at a low level at this time.

Then, when the input signal provided at the first signal input terminal STV_N−1 becomes a low level, the first transmission gate M1 outputs a low level, the NAND gate NAD1 outputs a high level, and the tenth transistor P10 is turned on. Since the first clock signal provided at the first clock signal terminal CK1 is at a high level, the level at the second node K2 is still a high level, the fifth inverter INV5 outputs a low level, the fifth transmission gate M5 is turned on and outputs a high level, the third transmission gate M3 is turned off, and the output signal of the output sub-circuit 30 (i.e., the output signal at the output terminal OUT) is at a low level at this time.

In a period t3, the start signal of the shift register unit is at a low level, that is, the input signal provided at the first signal input terminal STV_N−1 is at a low level, the first clock signal provided at the first clock signal terminal CK1 is at a low level, and the second clock signal provided at the second clock signal terminal CK2 is firstly at a high level and then at a low level. When the input signal provided at the first signal input terminal STV_N−1 is at a low level, the first transmission gate M1 outputs a low level, the NAND gate NAD1 outputs a high level, and the tenth transistor P10 is turned on. Since the first clock signal provided at the first clock signal terminal CK1 is at a low level, the level at the second node K2 becomes a low level, the fifth inverter INV5 outputs a high level, the fifth transmission gate M5 is turned off, the twelfth transistor P12 is turned on, and the third transmission gate M3 is turned on. When the second clock signal provided at the second clock signal terminal CK2 is at a high level, the third transmission gate M3 outputs a high level, and the output signal of the output sub-circuit 30 (i.e., the output signal at the output terminal OUT) is at a high level at this time. When the second clock signal provided at the second clock signal terminal CK2 is at a low level, the third transmission gate M3 outputs a low level, and the output signal of the output sub-circuit 30 (i.e., the output signal at the output terminal OUT) is at a low level at this time.

In a period t4, the start signal of the shift register unit is at a low level, that is, the input signal provided at the first signal input terminal STV_N−1 is at a low level, the first clock signal provided at the first clock signal terminal CK1 is at a high level, and the second clock signal provided at the second clock signal terminal CK2 is firstly at a high level and then at a low level. When the input signal provided at the first signal input terminal STV_N−1 is at a low level, the first transmission gate M1 outputs a low level, the NAND gate NAD1 outputs a high level, and the tenth transistor P10 is turned on. Since the first clock signal provided at the first clock signal terminal CK1 is at a high level, the level at the second node K2 is a high level, the fifth inverter INV5 outputs a low level, the fifth transmission gate M5 is turned on and outputs a high level, the third transmission gate M3 is turned off, and the output signal of the output sub-circuit 30 (i.e., the output signal at the output terminal OUT) is at a low level at this time. Then, the output signal at the output signal terminal OUT is at a low level.

In the above operation process, when the output signal at the output terminal OUT is at a low level, the first transistor P1 is turned on, the input terminal of the third inverter INV3 is at a high level, and the third inverter INV3 outputs a low level, so that the output signal OUT2 is maintained at a low level. When the output signal at the output terminal OUT is at a high level, the second transistor P2 is turned on, the input terminal of the third inverter INV3 is at a low level, and the third inverter INV3 outputs a high level, so that the output signal at the output terminal OUT is maintained at a high level. Thus, a PMOS transistor and an NMOS transistor are added at the output terminal to form a loop, so as to latch the output signal, thereby effectively reducing the noise of the output signal while enhancing the driving capability of the output signal. Further, the first transistor P1 and the second transistor P2 enable the signal at the input terminal of the third inverter INV3 to be always maintained at a high level/low level, so that the output signal of the third inverter INV3 may be quickly reversed, and thereby the output signal may be quickly reversed, thereby improving the stability and the effectiveness of the output signal. Thus, the output signal is latched by the latch sub-circuit 40, so that the output signal may be maintained in the current state, which may effectively reduce the noise of the output signal, enhance the driving capability of the output signal, and improve the stability and the effectiveness of the output signal, thereby effectively improving the performance of the display panel.

It should be illustrated that the first clock signal provided at the corresponding first clock signal terminal CK1 and the second clock signal provided at the corresponding second clock signal terminal CLK2 when the shift register unit shown in FIG. 5a performs forward scanning are at an opposite level to those when the shift register unit performs reverse scanning.

For example, when the shift register unit of FIG. 5b performs forward scanning, the first control signal provided at the first signal control terminal CN is at a high level, and the second control signal provided at the second signal control terminal CNB is at a low level. The first clock signal provided at the clock signal terminal CK1 and the second clock signal provided at the second clock signal terminal CK2 are as shown in FIG. 5b. When the shift register unit of FIG. 5b performs reverse scanning, the first control signal provided at the first signal control terminal CN is at a low level, and the second control signal provided at the second signal control terminal CNB is at a high level. The first clock signal provided at the first clock signal terminal CK1 is at an opposite level to that of the first clock signal shown in FIG. 5b, that is, is a reversed signal of the first clock signal shown in FIG. 5b. A specific process of reverse scanning may be known with reference to that of forward scanning, and will not be described in detail here.

Figure 6:
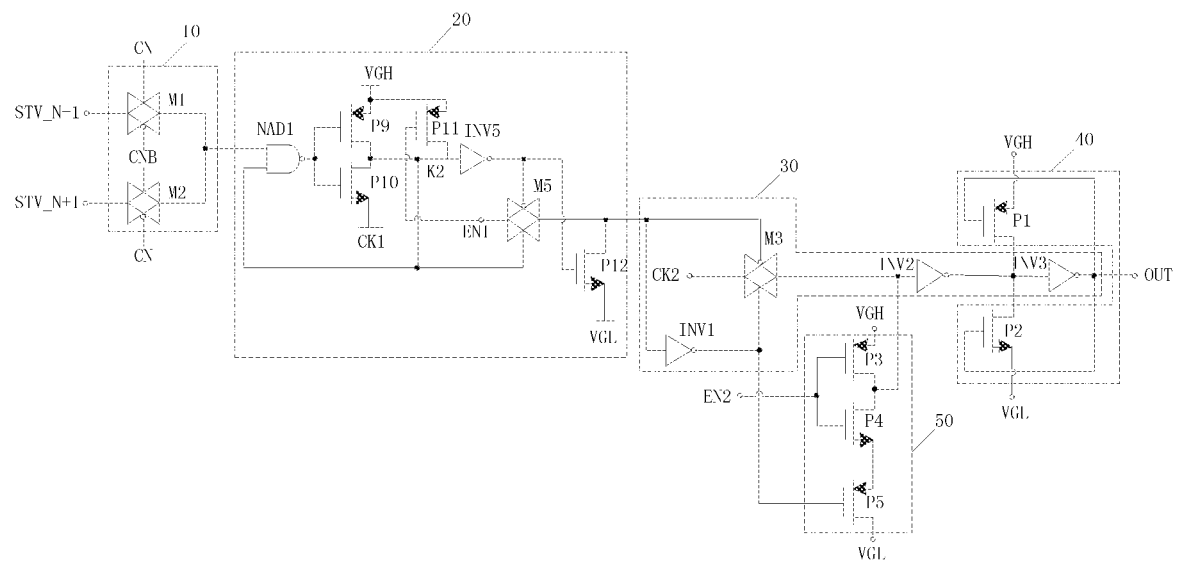
FIG. 6 is a schematic structural diagram of a shift register unit according to yet another embodiment of the present disclosure.

In addition, the shift register unit shown in FIG. 5a may further have the reset sub-circuit 50 shown in FIG. 3. As shown in FIG. 6, the reset sub-circuit 50 may realize rapid discharging or resetting of the pixel circuit.

Specifically, in a normal operation process, the second enabling signal provided at the second enabling signal terminal EN2 is at a high level, and when the second enabling signal provided at the second enabling signal terminal EN2 is at a low level, the procedure enters a rapid discharging or resetting mode. Here, when the second enabling signal provided at the second enabling signal terminal EN2 is at a high level, it may be seen from the above analysis that in the period t1, the fifth transmission gate M5 outputs a high level, the first inverter INV1 outputs a low level, the fourth transistor P4 and the fifth transistor P5 are both turned on at this time, the input terminal of the second inverter INV2 is at a low level, and the output signal of the output sub-circuit 30 (i.e., the output signal at the output terminal OUT) is at a low level. In the period t2, the fifth transmission gate M5 outputs a high level, the first inverter INV1 outputs a low level, the fourth transistor P4 and the fifth transistor P5 are both turned on at this time, the input terminal of the second inverter INV2 is at a low level, and the output signal of the output sub-circuit 30 (i.e., the output signal at the output terminal OUT) is at a low level. In the period t3, the twelfth transistor P12 is turned on, the first terminal of the twelfth transistor P12 is at a low level, the third transmission gate M3 is turned on, and when the second clock signal provided at the second clock signal terminal CK2 is at a high level, the third transmission gate M3 outputs a high level, and at the same time, the first inverter INV1 outputs a high level. At this time, the fourth transistor P4 is turned on, the input terminal of the second inverter INV2 is at a high level, and the output signal of the output sub-circuit 30 (i.e., the output signal at the output terminal OUT) is at a high level. When the second clock signal provided at the second clock signal terminal CK2 becomes a low level, the third transmission gate M3 outputs a low level, and the first inverter INV1 outputs a high level. At this time, the fourth transistor P4 is turned on, the input terminal of the second inverter INV2 is at a low level, and the output signal of the output sub-circuit 30 (i.e., the output signal at the output terminal OUT) is at a low level.

When the second enabling signal provided at the second enabling signal terminal EN2 is at a low level, for example, the second enabling signal provided at the second enabling signal terminal EN2 is at a low level after each frame time ends, the third transistor P3 is turned on at this time, the input terminal of the second inverter INV2 is at a high level, and the output signal of the output sub-circuit 30 (i.e., the output signal at the output terminal OUT) is at a high level. At this time, the transistors of the pixel circuit in the display area are turned on, charges of the pixel circuit are released, and when the second enabling signal provided at the second enabling signal terminal EN2 is at a low level for a period of time, the charges may be completely released, thereby realizing rapid discharging or resetting of the pixel circuit.

In summary, according to the shift register unit of the embodiment of the present disclosure, the input sub-circuit outputs the input signal provided at the signal input terminal under action of the control signal provided at the signal control terminal, the carry signal output sub-circuit generates a carry signal according to the input signal, the first clock signal provided at the first clock signal terminal and the first enabling signal provided at the first enabling signal terminal, the output sub-circuit generates an output signal according to the carry signal and the second clock signal provided at the second clock signal terminal, and the latch sub-circuit latches the output signal, which may effectively reduce the noise of the output signal, enhance the driving capability of the output signal, improve the stability and the effectiveness of the output signal, thereby effectively improving the performance of the display panel.

Figure 7:
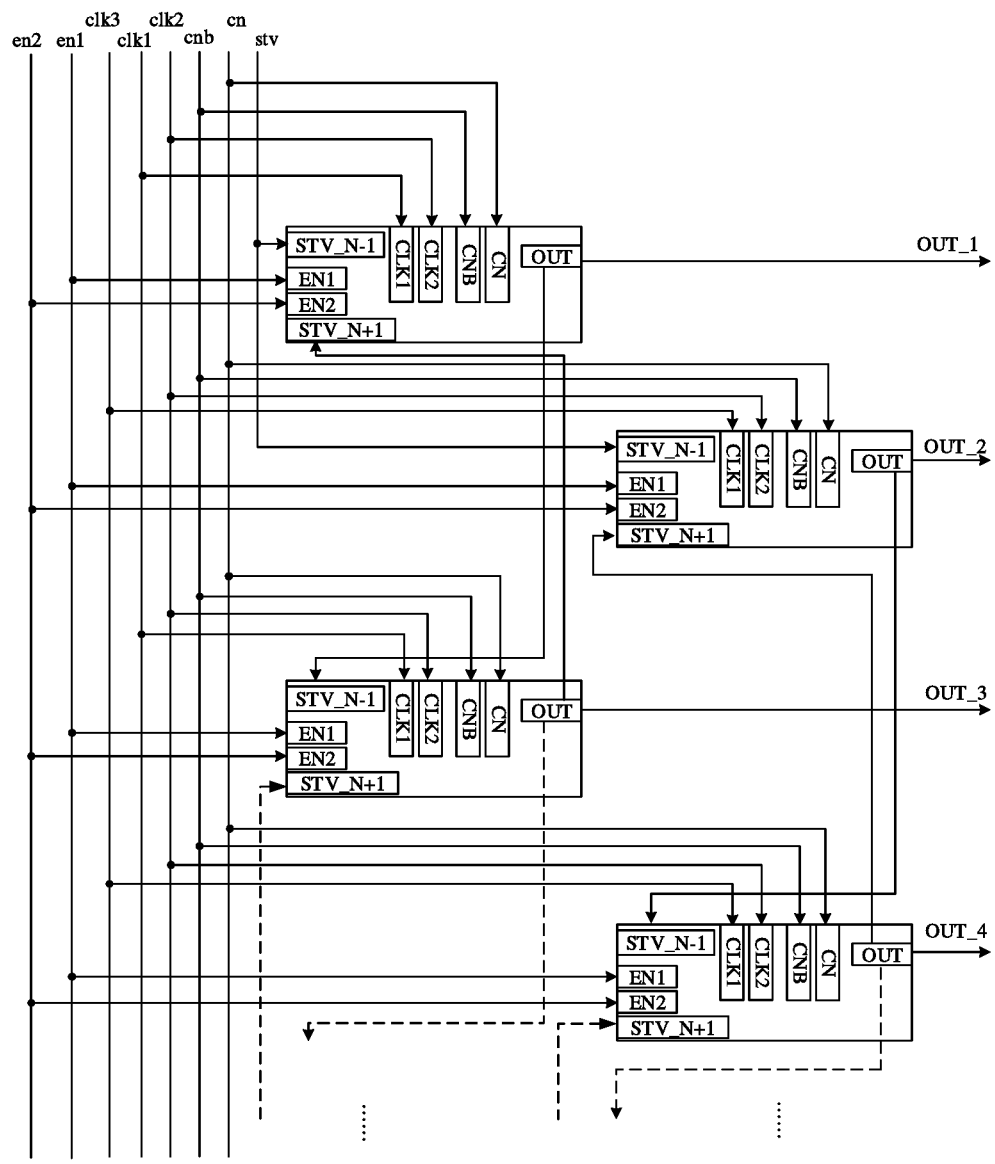
FIG. 7 is a schematic structural diagram of a gate driving circuit according to an embodiment of the present disclosure.

FIG. 7 is a schematic structural diagram of a gate driving circuit according to an embodiment of the present disclosure. As shown in FIG. 7, the gate driving circuit may comprise N cascaded shift register units, wherein each of the N cascaded shift register units is the shift register unit shown in FIG. 4 or the shift register unit shown in FIG. 6, where N is an integer greater than 1.

In FIG. 7, first signal input terminals STV_N−1 of a first stage of shift register unit and a second stage of shift register unit are both connected to an enabling signal line sty, an output terminal OUT of a $(2i-1)^{th}$ stage of shift register unit is connected to a first signal input terminal STV_N−1 of a $(2i+1)^{th}$ stage of shift register unit, and an output terminal OUT of a $(2i)^{th}$ stage of shift register unit is connected to a first signal input terminal STV_N−1 of a $(2i+2)^{th}$ stage of shift register unit, where i is an integer greater than or equal to 1 and less than N. Second signal input terminals STV_N+1 of an $(N-1)^{th}$ stage of shift register unit and an $N^{th}$ stage of shift register unit are both connected to the enabling signal line sty. An output terminal OUT of the $(2i+1)^{th}$ stage of shift register unit is connected to a second signal input terminal STV_N+1 of the $(2i-1)^{th}$ stage of shift register unit. An output terminal OUT of the $(2i+2)^{th}$ stage of shift register unit is connected to a second signal input terminal STV_N+1 of the $(2i)^{th}$ stage of shift register unit. First clock signal terminals CLK1 of the $(2i-1)^{th}$ stage of shift register unit and the $(2i+1)^{th}$ stage of shift register unit are both connected to a first clock signal line clk1. First clock signal terminals CLK1 of the $(2i)^{th}$ stage of shift register unit and the $(2i+2)^{th}$ stage of shift register unit are both connected to a third clock signal line clk3. A first clock signal provided by the first clock signal line clk1 is at an opposite level to that of a third clock signal provided by the third clock signal line clk3. A second clock signal terminal CLK2 of each of the N shift register units is connected to a second clock signal line clk2. A frequency of a second clock signal provided by the second clock signal line clk2 is twice that of the first clock signal. A first enabling signal terminal EN1 of each shift register unit is connected to a first enabling signal line en1 to receive a first enabling signal, a second enabling signal terminal EN2 of each shift register unit is connected to a second enabling signal line en2 to receive a second enabling signal, a first signal control terminal CN of each shift register unit is connected to a first signal control line cn to receive a first control signal, and a second signal control terminal CNB of each shift register unit is connected to a second signal control line cnb to receive a second control signal. Each stage of shift register unit outputs a corresponding output signal for driving a corresponding pixel on the display panel. For example, an output signal OUT_1 is provided at an output terminal OUT of the first stage of shift register unit, an output signal OUT_2 is provided at an output terminal OUT of the second stage of shift register unit, an output signal OUT_3 is provided at an output terminal OUT of a third stage of shift register unit, and so on.

That is, when the gate driving circuit comprises one of the N shift register units shown in FIG. 4 and the N shift register units shown in FIG. 6, the N cascaded shift register units are divided into odd-numbered stages of shift register units and even-numbered stages of shift register units, wherein the odd-numbered stages of shift register units are cascaded, the even-numbered stages of shift register units are cascaded, and first clock signals at first clock signal terminals CLK1 of the odd-numbered stages of shift register units are at an opposite level to that of first clock signals at first clock signal terminals CLK1 of the even-numbered stages of shift register units, which may realize driving of the gate driving circuit, to enable display of the display panel. Each shift register unit may realize forward scanning and reverse scanning, so that forward scanning and reverse scanning of the gate driving circuit may be realized. A specific operation process may be known with reference to those of the shift register units shown in FIG. 4 and FIG. 6, and will not be described in detail here.

According to the gate driving circuit of the embodiment of the present disclosure, the shift register unit may not only effectively reduce the noise of the output signal, enhance the driving capability of the output signal, and improve the stability and the effectiveness of the output signal, thereby effectively improving the performance of the display panel, but also may achieve forward scanning and reverse scanning.

Figure 8:
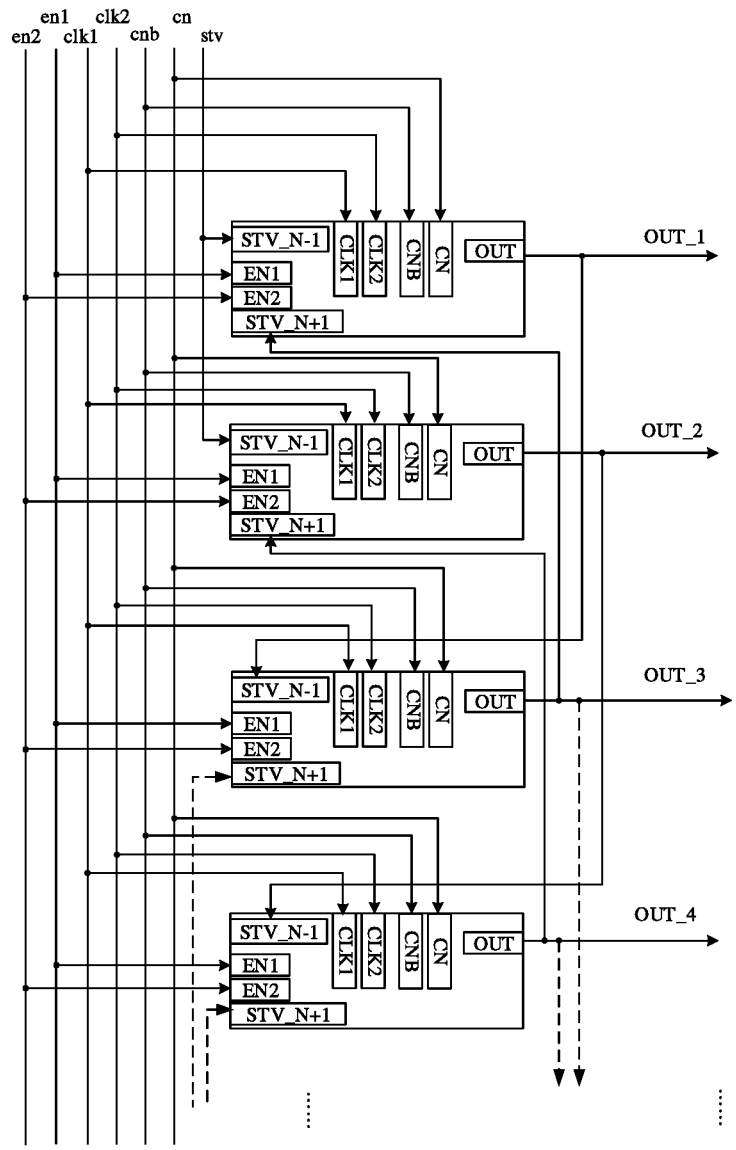
FIG. 8 is a schematic structural diagram of a gate driving circuit according to another embodiment of the present disclosure.

FIG. 8 is a schematic structural diagram of a gate driving circuit according to another embodiment of the present disclosure. As shown in FIG. 8, the gate driving circuit may comprise N cascaded shift register units, a $(2i-1)^{th}$ shift register unit among the N cascaded shift register units is the shift register unit shown in FIG. 4, and a $(2i)^{th}$ shift register unit among the N shift register units is the shift register unit shown in FIG. 6, where N is an integer greater than 1, and i is an integer greater than or equal to 1 and less than N.

In FIG. 8, first signal input terminals STV_N−1 of a first stage of shift register unit and a second stage of shift register unit are both connected to an enabling signal line sty, an output terminal OUT of a $(2i-1)^{th}$ stage of shift register unit is connected to a first signal input terminal STV_N−1 of a $(2i+1)^{th}$ stage of shift register unit, and an output terminal OUT of a $(2i)^{th}$ stage of shift register unit is connected to a first signal input terminal STV_N−1 of a $(2i+2)^{th}$ stage of shift register unit. Second signal input terminals STV_N+1 of an $(N-1)^{th}$ stage of shift register unit and an $N^{th}$ stage of shift register unit are both connected to the enabling signal line sty. An output terminal OUT of the $(2i+1)^{th}$ stage of shift register unit is connected to a second signal input terminal STV_N+1 of the $(2i-1)^{th}$ stage of shift register unit. An output terminal OUT of the $(2i+2)^{th}$ stage of shift register unit is connected to a second signal input terminal STV_N+1 of the $(2i)^{th}$ stage of shift register unit. A first clock signal terminal CLK1 of each of the N stages of shift register units is connected to a first clock signal line clk1. A second clock signal terminal CLK2 of each shift register unit is connected to a second clock signal line clk2. A frequency of a second clock signal provided by the second clock signal line clk2 is twice that of a first clock signal provided by the first clock signal line clk1. A first enabling signal terminal EN1 of each shift register unit is connected to a first enabling signal line en1 to receive a first enabling signal, a second enabling signal terminal EN2 of each shift register unit is connected to a second enabling signal line en2 to receive a second enabling signal, a first signal control terminal CN of each shift register unit is connected to a first signal control line cn to receive a first control signal, and a second signal control terminal CNB of each shift register unit is connected to a second signal control line cnb to receive a second control signal. Each stage of shift register unit outputs a corresponding output signal for driving a corresponding pixel on the display panel. For example, an output signal OUT_1 is provided at an output terminal OUT of the first stage of shift register unit, an output signal OUT_2 is provided at an output terminal OUT of the second stage of shift register unit, an output signal OUT_3 is provided at an output terminal OUT of a third stage of shift register unit, and so on.

That is, the gate driving circuit shown in FIG. 8 operates using two stages of circuits cooperatively, and may realize two stages of outputs in the same signal condition, which effectively reduces the use of signal lines, and reduces the occupied area, and each shift register unit may realize forward scanning and reverse scanning, so as to realize forward scanning and reverse scanning of the gate driving circuit. A specific operation process may be known with reference to those of the shift register units shown in FIGS. 4 and 6, and will not be described in detail here.

According to the gate driving circuit of the embodiment of the present disclosure, the shift register unit may not only effectively reduce the noise of the output signal, enhance the driving capability of the output signal, and improve the stability and the effectiveness of the output signal, thereby effectively improving the performance of the display panel, but also may realize forward scanning and reverse scanning. At the same time, the odd-numbered stages of shift register units and the even-numbered stages of shift register units operate cooperatively, which may realize two stages of outputs in the same signal condition, thereby effectively reducing the use of the signal lines and reducing the occupied area.

Figure 9:
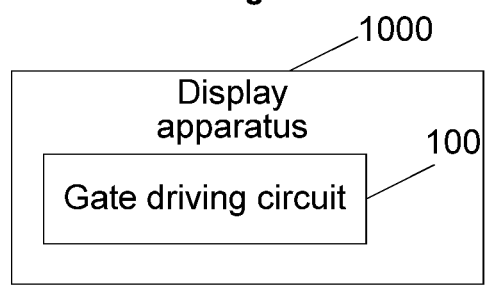
FIG. 9 is a schematic block diagram of a display apparatus according to an embodiment of the present disclosure.

FIG. 9 is a schematic block diagram of a display apparatus according to an embodiment of the present disclosure. As shown in FIG. 9, the display apparatus 1000 may comprise a gate driving circuit 100, which may be implemented by the gate driving circuit according to any of the embodiments described above.

According to the display apparatus of the embodiment of the present disclosure, the gate driving circuit may not only effectively reduce the noise of the output signal, enhance the driving capability of the output signal, and improve the stability and the effectiveness of the output signal, thereby effectively improving the performance of the display apparatus, but also may realize forward scanning and reverse scanning. At the same time, the odd-numbered stages of shift register units and the even-numbered stages of shift register units operate cooperatively, which may realize two stages of outputs in the same signal condition, thereby effectively reducing the use of the signal lines and reducing the occupied area.

Figure 10:
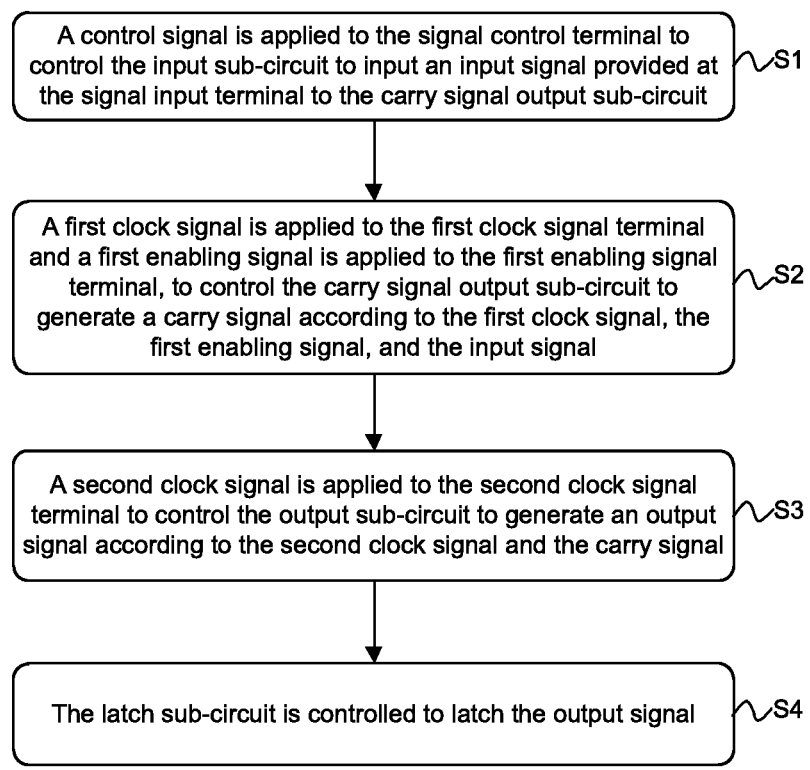
FIG. 10 is a flowchart of a method for driving a shift register unit according to an embodiment of the present disclosure.

FIG. 10 is a flowchart of a method for driving a shift register unit according to an embodiment of the present disclosure. Here, the shift register unit is the shift register unit according to any of the embodiments described above. As shown in FIG. 10, the method for driving a shift register unit according to the embodiment of the present disclosure may comprise the following steps.

In step S1, a control signal is applied to the signal control terminal to control the input sub-circuit to input an input signal provided at the signal input terminal to the carry signal output sub-circuit.

In step S2, a first clock signal is applied to the first clock signal terminal and a first enabling signal is applied to the first enabling signal terminal, to control the carry signal output sub-circuit to generate a carry signal according to the first clock signal, the first enabling signal, and the input signal.

In step S3, a second clock signal is applied to the second clock signal terminal to control the output sub-circuit to generate an output signal according to the second clock signal and the carry signal.

In step S4, the latch sub-circuit is controlled to latch the output signal.

According to an embodiment of the present disclosure, the control signal comprises a first control signal and a second control signal, wherein when the shift register unit performs forward scanning, the first control signal is at a high level, the second control signal is at a low level, and the input signal is an output signal from a previous stage of shift register unit; and when the shift register unit performs reverse scanning, the first control signal is at a low level, the second control signal is at a high level, and the input signal is an output signal from a next stage of shift register unit, wherein a first clock signal when the shift register unit performs reverse scanning is at an opposite level to that of a first clock signal when the shift register unit performs forward scanning.

According to an embodiment of the present disclosure, a frequency of the second clock signal is twice that of the first clock signal.

It should be illustrated that, details which are not disclosed in the method for driving a shift register unit according to the embodiment of the present disclosure may be known with reference to those disclosed in the shift register unit according to the embodiment of the present disclosure, and will not be described in detail here.

In the method for driving a shift register unit according to the embodiment of the present disclosure, a control signal is applied to the signal control terminal to input an input signal provided at the signal input terminal to the shift register unit, a first clock signal is applied to the first clock signal terminal, a first enabling signal is applied to the first enabling signal terminal to generate a carry signal according to the first clock signal, the first enabling signal and the input signal, and a second clock signal is applied to the second clock signal terminal, to generate an output signal according to the second clock signal and the carry signal and latch the output signal. Thereby, the noise of the output signal may be effectively reduced, the driving capability of the output signal may be enhanced, and the stability and the effectiveness of the output signal may be improved, thereby effectively improving the performance of the display panel.

In the description of the present disclosure, the terms "first" and "second" are used for descriptive purposes only, and are not to be construed as indicating or implying a relative importance or implicitly indicating a number of technical features indicated. Thus, features defined by "first" or "second" may comprise at least one of the features, either explicitly or implicitly. In the description of the present disclosure, "a plurality" means at least two, such as two, three, etc., unless specifically defined otherwise.

In the present disclosure, unless explicitly stated or defined otherwise, the terms "installed", "connected with", "connected to", "fixed", etc., are to be understood broadly. For example, they may be either fixed connection or detachable connection, or integration; may be mechanical connection or electrical connection; may be direct connection, or indirect connection through an intermediate medium, or may be internal communication between two elements or interaction between two elements, unless otherwise specified. Specific meanings of the above terms in the present disclosure may be understood by those of ordinary skill in the art according to specific conditions.

In the description of the present specification, the description with reference to the terms "one embodiment", "some embodiments", "example", "specific example", or "some examples" etc. means specific features, structures, materials, or characteristics described in connection with the embodiment or example are included in at least one embodiment or example of the present disclosure. In the present specification, the schematic representation of the above terms is not necessarily directed to the same embodiment or example. Further, the specific features, structures, materials, or characteristics described may be combined in a suitable manner in any one or more embodiments or examples. In addition, various embodiments or examples described in the specification and features of various embodiments or examples may be combined and integrated by those skilled in the art without a contradiction.

Although the embodiments of the present disclosure have been shown and described above, it may be understood that the above embodiments are illustrative and are not to be construed as limiting the present disclosure. Those of ordinary skill in the art may make changes, modifications, substitutions and variations to the above embodiments within the scope of the present disclosure.

I claim:

1. A shift register unit, comprising:
    an input sub-circuit connected to a signal input terminal and a signal control terminal, and configured to output an input signal provided at the signal input terminal under control of a control signal provided at the signal control terminal;
    a carry signal output sub-circuit connected to a first clock signal terminal and a first enabling signal terminal, and configured to generate a carry signal according to the input signal output by the input sub-circuit, a first clock signal provided at the first clock signal terminal and a first enabling signal provided at the first enabling signal terminal;
    an output sub-circuit connected to a second clock signal terminal and configured to generate an output signal according to the carry signal and a second clock signal provided at the second clock signal terminal; and
    a latch sub-circuit configured to latch the output signal, wherein the carry signal output sub-circuit comprises:
        a NOR gate having a first input terminal connected to an output terminal of the input sub-circuit;
        a sixth transistor and a seventh transistor, wherein a control terminal of the sixth transistor and a control terminal of the seventh transistor are connected to an output terminal of the NOR gate, a first terminal of the sixth transistor is connected to the first clock signal terminal, a second terminal of the sixth transistor is connected to a first terminal of the seventh transistor at a first node, the first node is connected to a second input terminal of the NOR gate, and a second terminal of the seventh transistor is connected to a reference signal terminal;
        a fourth inverter having an input terminal connected to the first node;
        a fourth transmission gate having an input terminal connected to the first enabling signal terminal, a first gating signal terminal connected to an output terminal of the fourth inverter, and a second gating signal terminal connected to the first node; and
        an eighth transistor having a control terminal connected to the first node, a first terminal connected to an output terminal of the fourth transmission gate to act as an output terminal of the carry signal output sub-circuit, and a second terminal connected to a reference signal terminal.

2. The shift register unit according to claim 1, wherein the signal input terminal comprises a first signal input terminal and a second signal input terminal, the signal control terminal comprises a first signal control terminal and a second signal control terminal, and the input sub-circuit comprises:
    a first transmission gate having an input terminal connected to the first signal input terminal, and a first gating signal terminal connected to the first signal control terminal; and
    a second transmission gate, wherein an input terminal of the second transmission gate is connected to the second signal input terminal, a first gating signal terminal of the second transmission gate and a second gating signal terminal of the first transmission gate are connected to the second signal control terminal, a second gating signal terminal of the second transmission gate is connected to the first signal control terminal, and an output terminal of the second transmission gate is connected to an output terminal of the first transmission gate to act as an output terminal of the input sub-circuit.

3. The shift register unit according to claim 2, wherein:
    the first transmission gate is configured to be turned on in a forward scanning phase in which a first control signal provided at the first signal control terminal is at a high level and a second control signal provided at the second signal control terminal is at a low level, to output a first input signal provided at the first signal input terminal; and
    the second transmission gate is configured to be turned on in a reverse scanning phase in which the first control signal provided at the first signal control terminal is at a low level and the second control signal provided at the second signal control terminal is at a high level, to output a second input signal provided at the second signal input terminal.

4. The shift register unit according to claim 3, wherein the first clock signal provided at the first clock signal terminal in the forward scanning phase is a reversed signal of the first clock signal provided at the first clock signal terminal in the reverse scanning phase.

5. The shift register unit according to claim 1, wherein the output sub-circuit comprises:
   a third transmission gate having an input terminal connected to the second clock signal terminal, and a first gating signal terminal connected to an output terminal of the carry signal output sub-circuit to receive the carry signal;
   a first inverter having an input terminal connected to the first gating signal terminal of the third transmission gate, and an output terminal connected to a second gating signal terminal of the third transmission gate;
   a second inverter having an input terminal connected to an output terminal of the third transmission gate; and
   a third inverter having an input terminal connected to an output terminal of the second inverter, and an output terminal acting as an output terminal of the output sub-circuit.

6. The shift register unit according to claim 5, wherein the latch sub-circuit comprises:
   a first transistor having a control terminal connected to the output terminal of the output sub-circuit, a first terminal connected to a power signal terminal, and a second terminal connected to the input terminal of the third inverter; and
   a second transistor having a control terminal connected to the output terminal of the output sub-circuit, a first terminal connected to a reference signal terminal, and a second terminal connected to the input terminal of the third inverter.

7. The shift register unit according to claim 5, further comprising:
   a reset sub-circuit connected to a second enabling signal terminal, and configured to generate a reset signal according to a second enabling signal provided at the second enabling signal terminal to be output through the output sub-circuit.

8. The shift register unit according to claim 7, wherein the reset sub-circuit comprises:
   a third transistor and a fourth transistor, wherein a control terminal of the third transistor and a control terminal of the fourth transistor are connected to the second enabling signal terminal, a first terminal of the third transistor is connected to a power signal terminal, and a second terminal of the third transistor and a first terminal of the fourth transistor are connected to the input terminal of the second inverter; and
   a fifth transistor having a control terminal connected to the output terminal of the first inverter, a first terminal connected to a second terminal of the fourth transistor, and a second terminal connected to a reference signal terminal.

9. A gate driving circuit, comprising N cascaded shift register units according to claim 1, wherein N is an integer greater than 1.

10. A display apparatus, comprising the gate driving circuit according to claim 9.

11. A method for driving the shift register unit according to claim 1, comprising steps of:

applying a control signal to the signal control terminal to control the input sub-circuit to input an input signal provided at the signal input terminal to the carry signal output sub-circuit;
applying a first clock signal to the first clock signal terminal and applying a first enabling signal to the first enabling signal terminal to control the carry signal output sub-circuit to generate a carry signal according to the first clock signal, the first enabling signal and the input signal;
applying a second clock signal to the second clock signal terminal to control the output sub-circuit to generate an output signal according to the second clock signal and the carry signal; and
controlling the latch sub-circuit to latch the output signal,
wherein a frequency of the second clock signal is twice that of the first clock signal.

12. The method according to claim 11, wherein the control signal comprises a first control signal and a second control signal, the input signal comprises a first input signal and a second input signal, and the input sub-circuit of the shift register unit comprises a first transmission gate and a second transmission gate, wherein
   in a forward scanning phase, the first control signal is at a high level, the second control signal is at a low level, and the first transmission gate is turned on to output the first input signal provided at the first signal input terminal; and
   in a reverse scanning phase, the first control signal is at a low level, the second control signal is at a high level, and the second transmission gate is turned on to output the second input signal provided at the second signal input terminal.

13. The method according to claim 12, wherein the first clock signal in the reverse scanning phase is a reversed signal of the first clock signal in the forward scanning phase.

14. A shift register unit, comprising:
   an input sub-circuit connected to a signal input terminal and a signal control terminal, and configured to output an input signal provided at the signal input terminal under control of a control signal provided at the signal control terminal;
   a carry signal output sub-circuit connected to a first clock signal terminal and a first enabling signal terminal, and configured to generate a carry signal according to the input signal output by the input sub-circuit, a first clock signal provided at the first clock signal terminal and a first enabling signal provided at the first enabling signal terminal;
   an output sub-circuit connected to a second clock signal terminal and configured to generate an output signal according to the carry signal and a second clock signal provided at the second clock signal terminal; and
   a latch sub-circuit configured to latch the output signal,
   wherein the carry signal output sub-circuit comprises:
   a NAND gate having a first input terminal connected to an output terminal of the input sub-circuit;
   a ninth transistor and a tenth transistor, wherein a control terminal of the ninth transistor and a control terminal of the tenth transistor are connected to an output terminal of the NAND gate, a first terminal of the ninth transistor is connected to a power signal terminal, a second terminal of the ninth transistor is connected to a first terminal of the tenth transistor at a second node, the second node is connected to a second input terminal of the NAND gate, and a second terminal of the tenth transistor is connected to the first clock signal terminal;

an eleventh transistor having a control terminal connected to the first enabling signal terminal, a first terminal connected to the power signal terminal, and a second terminal connected to the second node;

a fifth inverter having an input terminal connected to the second node;

a fifth transmission gate having an input terminal connected to the first enabling signal terminal, a first gating signal terminal connected to an output terminal of the fifth inverter, and a second gating signal terminal connected to the second node; and a twelfth transistor having a control terminal connected to the output terminal of the fifth inverter, a first terminal connected to an output terminal of the fifth transmission gate to act as an output terminal of the carry signal output sub-circuit, and a second terminal connected to the reference signal terminal.

15. A gate driving circuit, comprising N cascaded shift register units according to claim 14, wherein N is an integer greater than 1.

16. A display apparatus, comprising the gate driving circuit according to claim 15.

17. A method for driving the shift register unit according to claim 14, comprising steps of:

applying a control signal to the signal control terminal to control the input sub-circuit to input an input signal provided at the signal input terminal to the carry signal output sub-circuit;

applying a first clock signal to the first clock signal terminal and applying a first enabling signal to the first enabling signal terminal to control the carry signal output sub-circuit to generate a carry signal according to the first clock signal, the first enabling signal and the input signal;

applying a second clock signal to the second clock signal terminal to control the output sub-circuit to generate an output signal according to the second clock signal and the carry signal; and controlling the latch sub-circuit to latch the output signal, wherein a frequency of the second clock signal is twice that of the first clock signal.

18. A gate driving circuit, comprising N cascaded shift register units, wherein N is an integer greater than 1, wherein:

$(2i-1)^{th}$ stage of shift register unit of the N cascaded shift register units is the shift register unit according to claim 1; and a $(2i)^{th}$ stage of shift register unit of the N cascaded shift register units comprises:

an input sub-circuit connected to a signal input terminal and a signal control terminal, and configured to output an input signal provided at the signal input terminal under control of a control signal provided at the signal control terminal;

a carry signal output sub-circuit connected to a first clock signal terminal and a first enabling signal terminal, and configured to generate a carry signal according to the input signal output by the input sub-circuit, a first clock signal provided at the first clock signal terminal and a first enabling signal provided at the first enabling signal terminal;

an output sub-circuit connected to a second clock signal terminal and configured to generate an output signal according to the carry signal and a second clock signal provided at the second clock signal terminal; and a latch sub-circuit configured to latch the output signal, wherein the carry signal output sub-circuit of the $(2i)^{th}$ stage of shift register unit of the N cascaded shift register units comprises:

a NAND gate having a first input terminal connected to an output terminal of the input sub-circuit;

a ninth transistor and a tenth transistor, wherein a control terminal of the ninth transistor and a control terminal of the tenth transistor are connected to an output terminal of the NAND gate, a first terminal of the ninth transistor is connected to a power signal terminal, a second terminal of the ninth transistor is connected to a first terminal of the tenth transistor at a second node, the second node is connected to a second input terminal of the NAND gate, and a second terminal of the tenth transistor is connected to the first clock signal terminal;

an eleventh transistor having a control terminal connected to the first enabling signal terminal, a first terminal connected to the power signal terminal, and a second terminal connected to the second node;

a fifth inverter having an input terminal connected to the second node;

a fifth transmission gate having an input terminal connected to the first enabling signal terminal, a first gating signal terminal connected to an output terminal of the fifth inverter, and a second gating signal terminal connected to the second node; and a twelfth transistor having a control terminal connected to the output terminal of the fifth inverter, a first terminal connected to an output terminal of the fifth transmission gate to act as an output terminal of the carry signal output sub-circuit, and a second terminal connected to the reference signal terminal, and i is an integer greater than or equal to 1 and less than N.

19. A display apparatus, comprising the gate driving circuit according to claim 18.

* * * * *

UNITED STATES PATENT AND TRADEMARK OFFICE
CERTIFICATE OF CORRECTION

| | | |
|---|---|---|
| PATENT NO. | : 10,923,207 B2 | Page 1 of 1 |
| APPLICATION NO. | : 16/511203 | |
| DATED | : February 16, 2021 | |
| INVENTOR(S) | : Fei Huang | |

It is certified that error appears in the above-identified patent and that said Letters Patent is hereby corrected as shown below:

In the Specification

Column 10, Line 55:
Delete "INTV1"
Insert -- INV1--

Column 15, Line 49:
Delete "sty"
Insert --stv--

Column 15, Line 59:
Delete "sty"
Insert --stv--

Column 17, Line 9:
Delete "sty"
Insert --stv--

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*